United States Patent
Galy et al.

(10) Patent No.: US 8,331,069 B2
(45) Date of Patent: Dec. 11, 2012

(54) STRUCTURE FOR PROTECTING AN INTEGRATED CIRCUIT AGAINST ELECTROSTATIC DISCHARGES

(75) Inventors: Philippe Galy, Le Touvet (FR); Christophe Entringer, Brignoud (FR); Johan Bourgeat, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 223 days.

(21) Appl. No.: 12/759,922

(22) Filed: Apr. 14, 2010

(65) Prior Publication Data

US 2010/0271741 A1    Oct. 28, 2010

(30) Foreign Application Priority Data

Apr. 27, 2009 (FR) ..................... 09 52751
Feb. 15, 2010 (EP) ..................... 10153639

(51) Int. Cl.
*H02H 9/00* (2006.01)
(52) U.S. Cl. ......................................................... 361/56
(58) Field of Classification Search ........................ None
See application file for complete search history.

(56) References Cited

U.S. PATENT DOCUMENTS

| | | | | |
|---|---|---|---|---|
| 4,246,594 A * | 1/1981 | Mori | | 257/162 |
| 5,182,220 A * | 1/1993 | Ker et al. | | 438/200 |
| 5,289,334 A * | 2/1994 | Ker et al. | | 361/56 |
| 6,097,066 A * | 8/2000 | Lee et al. | | 257/355 |
| 6,258,634 B1 | 7/2001 | Wang et al. | | |
| 6,410,965 B1 * | 6/2002 | Yu | | 257/356 |
| 6,512,662 B1 | 1/2003 | Wang | | |
| 6,573,566 B2 * | 6/2003 | Ker et al. | | 257/355 |
| 6,750,517 B1 * | 6/2004 | Ker et al. | | 257/401 |
| 6,936,898 B2 * | 8/2005 | Pelham et al. | | 257/371 |
| 7,645,673 B1 * | 1/2010 | Pelham et al. | | 438/289 |
| 2003/0075763 A1 * | 4/2003 | Ker et al. | | 257/355 |
| 2007/0091524 A1 * | 4/2007 | Davis | | 361/56 |
| 2008/0084641 A1 * | 4/2008 | Nagayama | | 361/56 |
| 2009/0090972 A1 | 4/2009 | Vinson | | |
| 2010/0232078 A1 * | 9/2010 | Bhattacharya et al. | | 361/56 |
| 2010/0271740 A1 * | 10/2010 | Galy et al. | | 361/56 |

OTHER PUBLICATIONS

Vashchenko V. A. et al., "Multi-port ESD protection using bi-directional SCR structures," Proceedings of the 2003 Bipolar/BICMOS Circuits and Technology Meeting (IEEE Cat. No. 03CH37440) IEEE, Piscataway, NJ, USA, 2003, pp. 137-140.

* cited by examiner

*Primary Examiner* — Rexford Barnie
*Assistant Examiner* — Angela Brooks
(74) *Attorney, Agent, or Firm* — The Noblitt Group, PLLC

(57) ABSTRACT

A structure for protecting an integrated circuit against electrostatic discharges, comprising an assembly of identical cells, each of which is connected to a terminal forming a pad of the circuit, a first supply rail, or a second supply rail, the cells forming between any two of said terminals an assembly of four alternated layers of different conductivity types.

3 Claims, 4 Drawing Sheets

STRUCTURE FOR PROTECTING AN INTEGRATED CIRCUIT AGAINST ELECTROSTATIC DISCHARGES

BACKGROUND OF THE INVENTION

1. Field of the Invention

The present invention relates to structures for protecting integrated circuits against electrostatic discharges.

2. Discussion of the Related Art

FIG. 1 is a simplified top view of an integrated circuit chip. The integrated circuit comprises a central portion 1 connected to a set of metal pads 3 arranged at the chip periphery and intended to ensure connections to the outside. Central portion 1 comprises all the components enabling the integrated circuit to perform desired functions. Some of pads 3 are intended to receive high ($V_{DD}$) and low ($V_{SS}$) supply voltages. High and low supply rails 5 and 7 are generally provided all around the circuit. The other pads 3 are especially intended for receiving and/or for providing input-output signals. The entire circuit is covered with an insulating layer which only leaves access to terminals connected to pads 3, and may be placed in a package comprising lugs at pads 3 or balls connected to these lugs.

Such a circuit generally receives and/or provides signals of low voltage level (for example, from 0.6 to 3 V) and low current intensity (for example, from 1 μA to 10 mA), and may be damaged when overvoltages or overintensities occur between pads of the package. Overvoltages may occur during the manufacturing or assembly phase, before the circuit is assembled in a device (for example, on a printed circuit board), during electrostatic discharges linked to the handling of the circuits by tools or by hand. Such overvoltages may reach several thousands of volts and destroy circuit elements.

It is thus provided to associate with each pad 3 a protection structure which generally takes up a ring-shaped area 9 arranged between pads 3 and central portion 1 of the chip. The protection structure must be able to rapidly remove significant currents, that may appear when an electrostatic discharge occurs between two pads or two terminals of the package.

FIG. 2 shows an example of a protection structure 10, associated with an input-output pad 3 of an integrated circuit. A diode 11 is forward-connected between pad 3 and high supply rail 5. A diode 13 is reverse-connected between pad 3 and low supply rail 7. A MOS transistor 15, used as a switch, is connected between high and low supply rails 5 and 7. An overvoltage detection circuit 17, connected in parallel with MOS transistor 15, provides this transistor with a turn-on signal. Overvoltage detection circuit 17 may for example be an edge detector comprising a resistor in series with a capacitor, the connection node between the resistor and the capacitor switching state in case of an abrupt overvoltage. MOS transistor 15 especially comprises a parasitic diode 16 forward-connected between rail 7 and rail 5.

The operation of the protection structure in case of an overvoltage occurring on an input-output pad (now simply called "pad") or on a pad connected to a supply rail (now simply called "rail") will be indicated hereafter.

In normal operation, when the chip is supplied, the signals on pads 3 and rails 5 and 7 are such that diodes 11 and 13 conduct no current and detection circuit 17 turns MOS transistor 15 off.

In case of a positive overvoltage between high and low supply rails 5 and 7, circuit 17 turns on transistor 15, which enables to remove the overvoltage.

In case of a negative overvoltage between high and low supply rails 5 and 7, diode 16 becomes conductive and the overvoltage is removed.

In case of a positive overvoltage between a pad 3 and high supply rail 5, diode 11 becomes conductive and the overvoltage is removed.

In case of a negative overvoltage between pad 3 and rail 5, circuit 17 turns on transistor 15, and the overvoltage is removed through transistor 15 and diode 13.

In case of a positive overvoltage between a pad 3 and low supply rail 7, diode 11 becomes conductive and the positive overvoltage is transferred onto high supply rail 5, which corresponds to the above-discussed case of a positive overvoltage between rails 5 and 7.

In case of a negative overvoltage between a pad 3 and low supply rail 7, diode 13 becomes conductive and the overvoltage is removed.

In case of a positive or negative overvoltage between two pads 3, diodes 11 or 13 associated with the concerned pads turn on, and the overvoltage is transferred to high and low supply rails 5 and 7. This corresponds to one of the above-discussed overvoltage cases.

A disadvantage of such a protection structure lies in the fact that, to be able to drain off the currents induced by electrostatic discharges, diodes 11 and 13 and transistor 15 must have a significant surface area (typically, a junction perimeter of 200 μm per diode and a gate width of 4,000 μm per transistor). As a result, ring-shaped area 9 (FIG. 1) takes up a significant silicon surface area, to the detriment of central portion 1 of the chip. Further, due to its large size, MOS transistor 15 in the off state is crossed by significant leakage currents, which increases the circuit consumption.

Further, diodes 11 and 13 and transistor 15 are separate components, which complicates the manufacturing of ring-shaped area 9. The separate components must further be isolated from one another, which increases the total silicon surface area of an integrated circuit.

Such a structure also has the disadvantage of reacting differently according to the type of overvoltage generated by an electrostatic discharge. Indeed, the paths for draining off the current differ according to the features of the overvoltages applied across the circuit.

Further, with such a protection structure, the amplitude of the input-output signals is limited to values ranging between low supply voltage $V_{SS}$ minus the threshold voltage of diode 13 and high supply voltage $V_{DD}$ plus the threshold voltage of diode 11. Outside this range of values, the diodes become conductive and the circuit can no longer operate properly.

FIG. 3 illustrates another example of a structure for protecting several pads of an integrated circuit. Instead of using one MOS protection transistor 15 for each pad 3 of the circuit, as described hereabove in relation with FIG. 2, a single MOS transistor 15 may be used to remove the overvoltages linked to several pads 3 of the circuit. One MOS transistor for from three to ten pads 3 of the circuit may for example be used. Only diodes 11 and 13 are repeated at each pad 3. A disadvantage of this structure is that, if an electrostatic discharge occurs between two pads remote from transistor 15 and from detection circuit 17, the overvoltage removal path is relatively long. Since the current induced by the discharge may be very strong, the resistivity of the rails creates a significant voltage between the pads. The overvoltage is thus poorly removed and risks damaging the circuit.

SUMMARY OF THE INVENTION

Thus, a feature of an embodiment of the preset invention is to provide a structure for protecting integrated circuits against electrostatic discharges, which overcomes all or at least some of the above-mentioned disadvantages of prior art solutions.

Another feature of an embodiment of the present invention is to provide such a structure, which takes up a small silicon surface area.

Another feature of an embodiment of the present invention is to provide such a structure which does not limit the values between which the amplitude of the input-output signals must range.

A still further feature of an embodiment of the present invention is to provide such a structure which does not disturb the proper operation of the circuit when the latter is supplied.

In particular, a feature of an embodiment of the present invention is to provide such a structure which exhibits no or only slight leakage currents when the circuit is supplied.

Another feature of the present invention is to provide such a structure which is easy to form.

Thus, an embodiment of the present invention provides a structure for protecting an integrated circuit against electrostatic discharges, comprising an assembly of identical cells, each of which is connected to a terminal forming a pad of the circuit, a first supply rail, or a second supply rail, the cells forming between any two of said terminals an assembly of four alternated layers of different conductivity types.

According to an embodiment of the present invention, the identical cells are formed in a layer of a first conductivity type of a first doping level, each cell comprising a well of a second conductivity type of a second doping level, containing on its surface side neighboring regions of doping levels greater than the first and second levels and of opposite conductivity types, in contact with a metallization connected to said terminal.

According to an embodiment of the present invention, contact regions of the first conductivity type and of a doping level greater than the first level are arranged on the upper surface side of said layer and are capable of receiving a turn-on signal.

According to an embodiment of the present invention, the contact regions are connected to the output of a turn-on circuit capable of providing a control signal in case of an overvoltage between any two of said terminals.

According to an embodiment of the present invention, said turn-on circuit comprises: an overvoltage detector capable of providing a high output signal when the integrated circuit is supplied; a first inverter having its input connected to the output of the detector; a second inverter having its input connected to the output of the first inverter, the output of the second inverter forming the output of the turn-on circuit; at least one first diode forward-connected between the output of the second inverter and the first supply rail; and a thyristor forward-connected between the output of the second inverter and a pad of the circuit, the anode and cathode gates of the thyristor being respectively connected to the output of the second inverter and to the second supply rail.

According to an embodiment of the present invention: said detector is formed of a first P-channel MOS transistor and of a first N-channel MOS transistor, the source and the drain of the first P-channel transistor being respectively connected to the first supply rail and to the gate of the first N-channel transistor, the gate of the first-P-channel transistor and the source and the drain of the first N-channel transistor being connected to the second supply rail; the first inverter is formed of a second P-channel MOS transistor and of a second N-channel MOS transistor and is supplied by the first and second supply rails; the second inverter is formed of a third P-channel MOS transistor and of a third N-channel MOS transistor and is supplied by the first and second supply rails.

According to an embodiment of the present invention, each pair of cells forms a triac between two of said terminals.

According to an embodiment of the present invention, the cells are arranged in a matrix in a ring-shaped area located between the pads and the central portion of the circuit.

According to an embodiment of the present invention: the cell matrix has rows parallel to the line of pads and columns orthogonal to this line; the portion of the ring-shaped area delimited by two successive pads contains at least three columns; and all the cells of a diagonal are connected to a same terminal.

According to an embodiment of the present invention, the diagonals of consecutive interconnected cells are connected to terminals forming, in the following order: the first supply rail; a pad of the circuit; the second supply rail; and a pad of the circuit.

The foregoing features, and benefits of the present invention will be discussed in detail in the following non-limiting description of specific embodiments in connection with the accompanying drawings.

DETAILED DESCRIPTION

Figure 1:
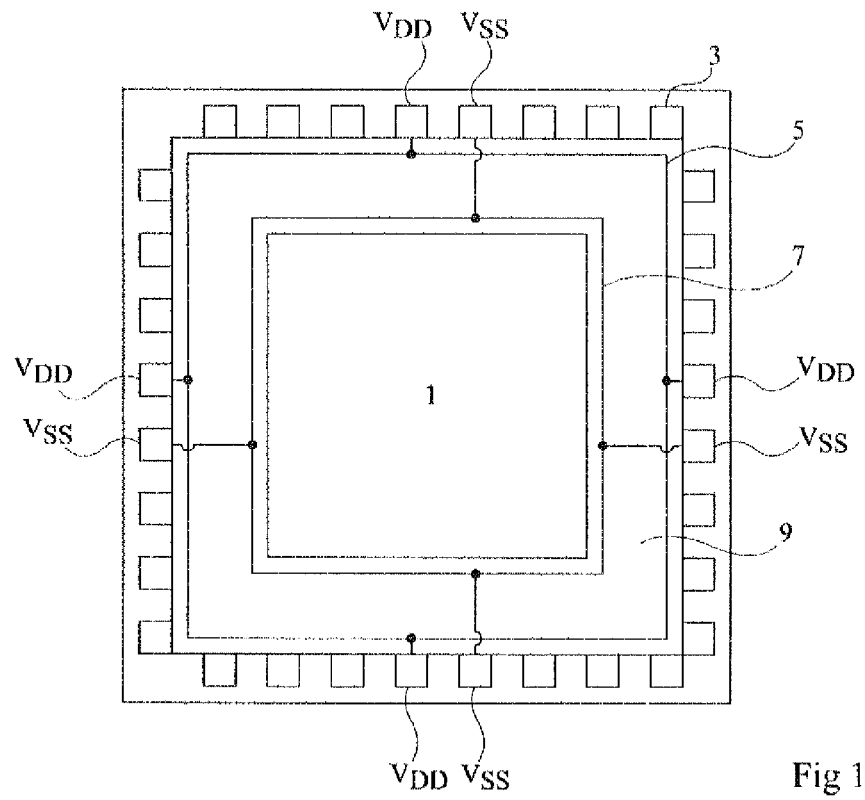
FIG. 1, previously described, is a simplified top view of an integrated circuit chip.

For clarity, the same elements have been designated with the same reference numerals in the different drawings and, further, as usual in the representation of integrated circuits, the various drawings are not to scale.

Figure 4:
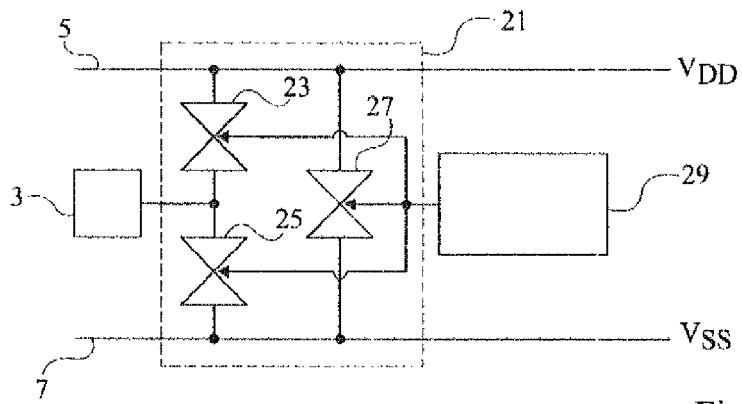
FIG. 4 shows an example of a protection structure associated with a pad of an integrated circuit according to an embodiment of the present invention.

FIG. 4 shows an example of a protection structure 21 associated with an input-output pad 3 of an integrated circuit. A first triac 23 is connected between pad 3 and high supply rail 5. A second triac 25 is connected between pad 3 and low supply rail 7. A third triac 27 is connected between rails 5 and 7. A detection circuit 29, adapted to detect possible overvoltages between any two pads of the circuit, simultaneously controls triacs 23, 25, and 27. An embodiment of circuit 29 will be discussed hereafter in relation with FIG. 8.

In normal operation, that is, when the chip is supplied, circuit 29 blocks triacs 23, 25, and 27.

In case of a positive or negative overvoltage between high and low supply rails 5 and 7, circuit 29 enables the triacs, and the overvoltage is removed, mainly by triac 27.

In case of a positive or negative overvoltage between a pad 3 and high supply rail 5, circuit 29 enables the triacs, and the overvoltage is removed, mainly by triac 23.

In case of a positive or negative overvoltage between a pad 3 and low supply rail 7, circuit 29 enables the triacs, and the overvoltage is removed, mainly by triac 25.

In case of a positive or negative overvoltage between two input-output pads, the triacs associated with the concerned pads are enabled, which enables the overvoltage to be removed.

Protection structure 21 thus enables to remove all the types of overvoltages that may occur between pads and/or rails of the circuit after an electrostatic discharge.

According to an aspect of the present invention, the various triacs are formed from an assembly of elementary cells identical to one another.

Figure 5:
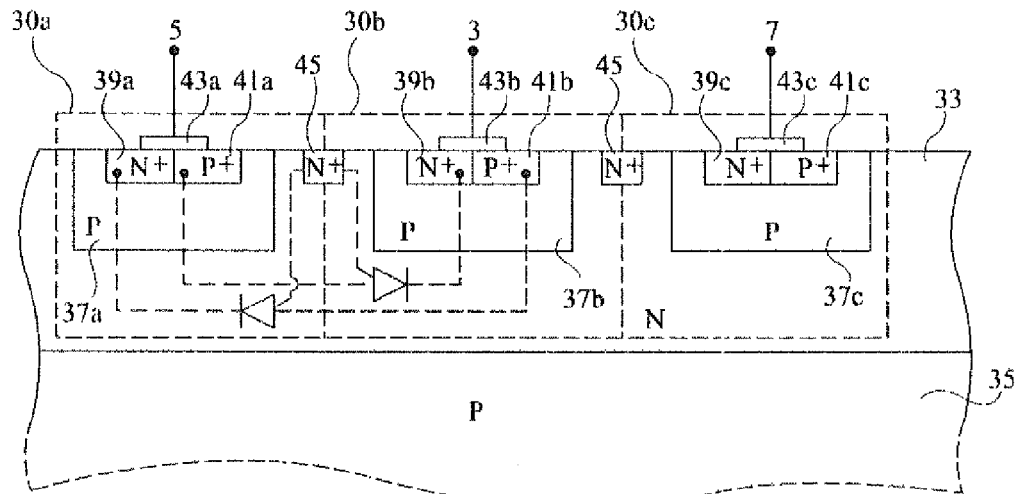
FIG. 5 is a cross-section view of a protection structure according to an embodiment of the present invention.

FIG. 5 is a cross-section view of elementary cells 30a, 30b, 30c contributing to the construction of protection structure 21 described in relation with FIG. 4. A lightly-doped N-type layer 33 is formed in a lightly-doped P-type silicon substrate 35. Elementary cells 30a, 30b, 30c are formed in the upper portion of N layer 33. Each elementary cell comprises, at the surface of a lightly-doped P-type well 37a, 37b, 37c, neighboring regions of high doping level and of different conductivity types. This doping level is especially greater than the doping levels of substrate 35, of layer 33, and of wells 37a, 37b, 37c. N-type regions 39a, 39b, 39c and P-type regions 41a, 41b, 41c are shown in FIG. 5. A metallization 43a, 43b, 43c forms an ohmic contact with each of pairs of regions 39a and 41a, 39b and 41b, 39c and 41c. Metallizations 43a, 43b, and 43c are respectively connected to high supply rail 5, to a pad 3 of the circuit, and to low supply rail 7. N layer 33 further comprises contact regions 45 intended to be connected to the output of a device for detecting overvoltages. Contact regions 45 are N-type regions of high doping level.

Each pair of cells forms between two metallizations a triac formed of two thyristors in anti-parallel. For example, between metallizations 43a and 43b, a first PNPN thyristor corresponding to regions 41a-33-37b-39b and a second PNPN thyristor corresponding to regions 41b-33-37a-39a can be found. The two thyristors have a common anode gate formed by contact region 45.

Figure 6:
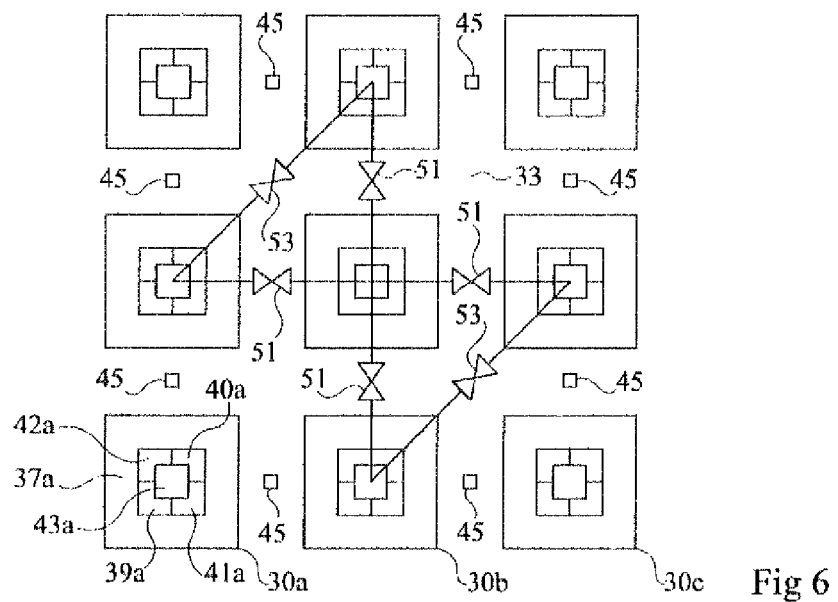
FIG. 6 is a top view of a portion of a protection structure according to an embodiment of the present invention.

FIG. 6 is a top view of an assembly of elementary cells 30a, 30b, 30c formed in an N layer 33 such as described hereabove (FIG. 5). In the illustrated embodiment, each cell comprises, at the surface of a lightly-doped P-type well 37a, in diagonal, two heavily-doped N-type regions 39a and 40a and two heavily-doped P-type regions 41a and 42a. The present invention is not limited to this specific case. Further, the present invention is not limited to the sole case illustrated in FIG. 6 in which regions 39a, 40a, 41a, and 42a are in direct contact with one another. Indeed, the heavily-doped N and P-type regions may be separate. A metallization 43a forms an ohmic contact with regions 39a, 40a, 41a, and 42a.

If the cells are arranged in a matrix (as shown), identical triacs 51 are formed by the pair of neighboring cells belonging to successive lines or columns of the matrix. Identical triacs 53 are formed by the pairs of neighboring cells belonging to successive diagonals of the matrix. It should be noted that the distance between main electrodes of triacs 53 is greater by a factor $\sqrt{2}$ than the distance between main electrodes of triacs 51. Since the capacity of a triac to drain off significant currents is linked to the distance between its electrodes, triacs 51 are more efficient than triacs 53. Contact regions 45, intended to be connected to the output of a device for detecting overvoltages, form the triac turn-on gate. Although contact regions 45 have been shown in the form of isolated points, the present invention is not limited to this specific case. Contact regions 45 may be lines of a grid surrounding the elementary cells or have any other geometric shape.

To form the desired protection structure 21 such as described hereabove in relation with FIG. 4, an assembly of elementary cells 30a, 30b, 30c arranged in a matrix in N layer 33 is provided. The arrangement of the matrix and the connections of the cells to the pads and rails of the circuit will be explained in further detail hereafter in relation with FIG. 7.

Figure 7:
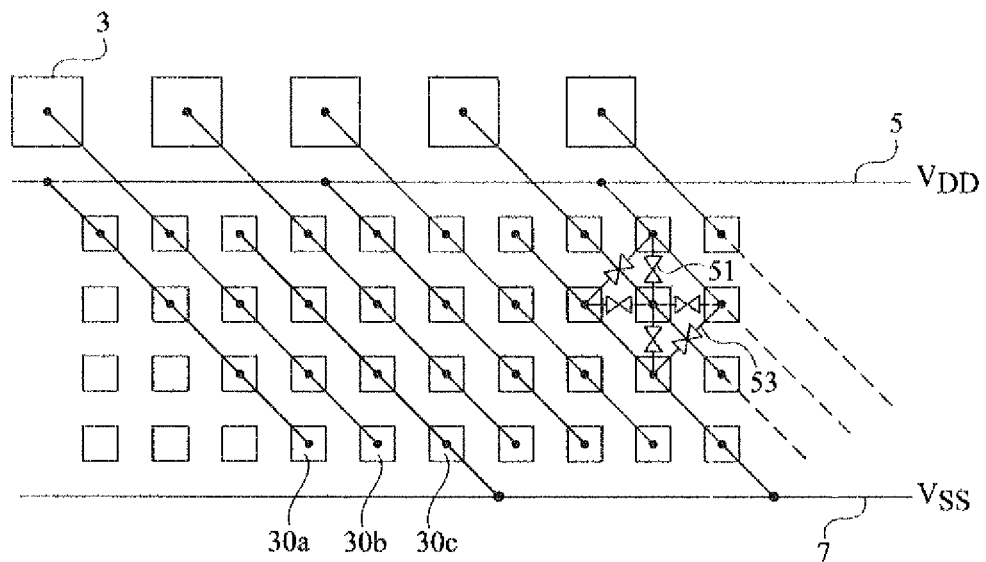
FIG. 7 is a simplified top view of a portion of a structure of protection against overvoltages according to an embodiment of the present invention.

FIG. 7 is a simplified top view of a portion of the protection structure described hereabove in relation with FIGS. 4 to 6. Elementary cells 30a, 30b, 30c, simply shown in the form of a square with a center point corresponding to their connection metallization, are arranged in the form of a matrix having rows parallel to the line of pads 3 and columns perpendicular to this line. The matrix takes up a ring-shaped area (corresponding to ring-shaped area 9 of FIG. 1) between pads 3 and the central portion of the circuit. The cells forming a diagonal of the matrix are connected to a same input-output pad 3 or supply rail 5 or 7. The consecutive diagonals are connected according to the following sequence to rail 5, to a pad 3, to rail 7, and to a pad 3. Triacs 53 are thus formed between supply rails 5 and 7, and triacs 51, more efficient than triacs 53, are formed between each pad 3 and rails 5 and 7. An advantage of the above-described connection sequence lies in the fact that triacs 53 of lesser efficiency are formed a large number of times in the structure, between rails 5 and 7. This large number compensates for their lower efficiency with respect to triacs 51. Due to contact regions 45 (FIG. 6) forming the gate of the triacs, all the triacs of the structure can be simultaneously enabled in case of an abrupt overvoltage, thus implementing the desired protection structure described hereabove in relation with FIG. 4.

Figure 8:
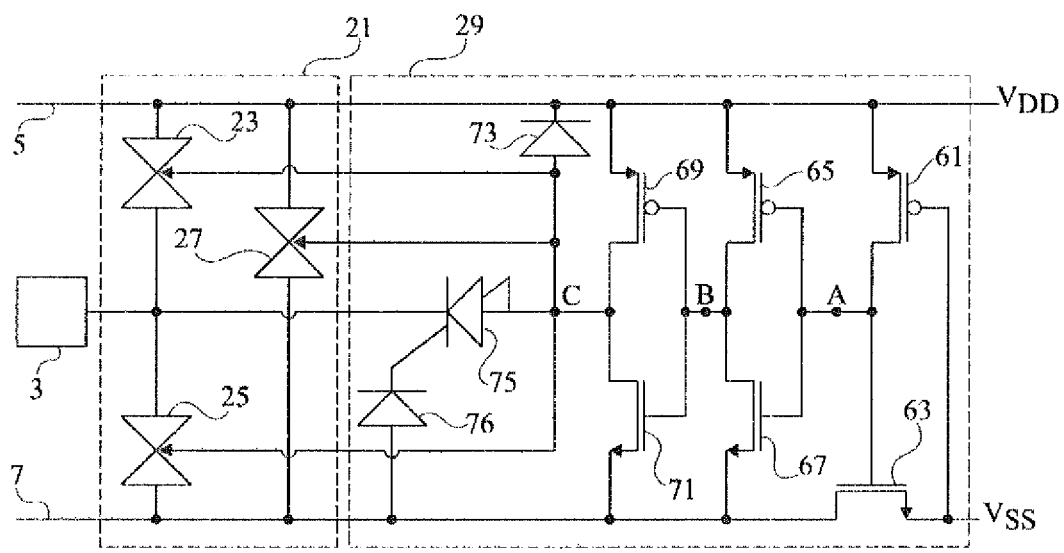
FIG. 8 is an embodiment of a turn-on circuit adapted to provide a signal to the protection structure shown in FIG. 4, in case of an overvoltage.

FIG. 8 shows an example of a circuit for detecting an overvoltage between any two pads or rails of the circuit, and for turning on the triacs of the protection structure.

FIG. 8 shows and details the circuit of FIG. 4. The protection structure 21 associated with an input-output pad 3 of the circuit is formed of three triacs 23, 25, and 27, connected between pad 3 and high and low supply rails 5 ($V_{DD}$) and 7 ($V_{SS}$) as described in relation with FIG. 4. Each triac is formed of two thyristors in antiparallel having a common anode gate.

Detection and turn-on circuit 29 comprises a dynamic edge detector comprising a P-channel MOS transistor 61 and an N-channel MOS transistor 63. The source of transistor 61 is connected to high rail 5. The drain of transistor 61 is connected to the gate of transistor 63 at a node A. The source and the drain of transistor 63 and the gate of transistor 61 are connected to low rail 7. Thus, transistors 61 and 63 respectively behave as a resistor and as a capacitor.

A first inverter is formed of a P-channel MOS transistor 65 and of an N-channel MOS transistor 67. The sources of transistors 65 and 67 are respectively connected to supply rails 5 and 7. The gates of transistors 65 and 67 are connected to node A and form the inverter input. The drains of transistors 65 and 67, interconnected at a node B, form the inverter output.

A second inverter is formed of a P-channel MOS transistor 69 and of an N-channel MOS transistor 71. The sources of transistors 69 and 71 are respectively connected to supply rails 5 and 7. The gates of transistors 69 and 71 are connected to output node B of the first inverter and form the input of the second inverter. The drains of transistors 69 and 71, interconnected at a node C, form the output of the second inverter.

Output C of the second inverter is connected to the gates of triacs 23, 25, and 27. A diode 73 is forward-connected between node C and high rail 5. A thyristor 75 is forward-connected between node C and pad 3. This thyristor comprises an anode gate (N-type region in which the anode region is formed) and a cathode gate (P-type region in which the cathode region is formed). The anode and the anode gate of thyristor 75 are interconnected. Thus, since there is a positive voltage difference between the anode and the cathode of thyristor 75, the latter is turned on if a turn-on current flows between its cathode gate and its cathode. Further, if no turn-on current flows in the cathode gate but the anode-cathode voltage difference is greater than a threshold, thyristor 75 starts an avalanche. The avalanche conduction threshold especially depends on the doping levels of the N and P-type regions forming the reverse diode of the thyristor and will currently be on the order of from 6 to 10 V. A diode 76 may be forward-connected between low rail 7 and the cathode gate of thyristor 75.

In normal operation, rail 5 is connected to a high positive voltage supply terminal ($V_{DD}$) and rail 7 is connected to a negative voltage terminal ($V_{SS}$). Output node A of the edge detector is in a high state and output node C of the second inverter is in a high state substantially corresponding to positive voltage $V_{DD}$ of rail 5. Since node C is connected to the anode gate of the thyristor forming triac 27, forward-connected between positive rail 5 and negative rail 7, no current can flow between the anode and the anode gate of this thyristor. Triac 27 and, similarly, triacs 23 and 25, thus remain off.

As seen previously, protection structure 21 enables the voltage on an input-output pad to vary outside of range $V_{SS}$, $V_{DD}$. The voltage excursion is only limited by the detection and turn-on circuit. In the case of the described specific embodiment of a detection and turn-on circuit, this excursion is limited by:

low supply voltage $V_{SS}$, minus the threshold voltage of the junction between the cathode and the cathode gate of thyristor 75 (minus the threshold voltage of diode 76, if provided), and high supply voltage $V_{DD}$, plus the threshold voltage of the junction between the anode and the anode gate of thyristor forming triac 23, forward-connected between rail 5 and pad 3, plus the threshold voltage of diode 73.

To further extend the range of values within which the amplitude of the input-output signals may vary, it is sufficient to add diodes in series with diodes 73 and 76.

When the chip is not supplied, output node A of the edge detector is in a low state. Since the inverters are not supplied, their outputs B and C are at undetermined states.

In case of a positive overvoltage between pad 3 and rail 7, the thyristor forming triac 25, forward-connected between pad 3 (here, positive) and rail 7 (here, negative), can be turned on. The PN junction formed between the anode and the anode gate of this thyristor tends to turn on, as well as diode 73, and a positive voltage is transferred onto rail 5. Thus, the overvoltage provides a supply voltage to the inverters formed by transistors 65, 67, 69, and 71. Output node A of the edge detector being at a low state, output node B of the first inverter switches to a high state, which turns on N-channel MOS transistor 71 of the second inverter. A current thus flows between pad 3 and rail 7, via the gate of triac 25 and transistor 71. This gate current turns on triac 25. Triac 25 is thus made conductive, which enables to remove the overvoltage.

In case of a negative overvoltage between pad 3 and rail 7, the thyristor forming triac 25, forward-connected between rail 7 (in this case, positive) and pad 3 (in this case, negative), is likely to be turned on. The PN junction formed between the anode and the anode gate of this thyristor tends to become conductive. A positive voltage is thus transferred onto anode C of thyristor 75, having its cathode connected to negative pad 3. The cathode gate of thyristor 75 being connected positive rail 7, thyristor 75 turns on. A current thus flows between pad 3 and rail 7, via the gate of triac 25 and thyristor 75. The gate current turns on triac 25. Triac 25 is thus made conductive, which enables to remove the overvoltage.

In case of a positive overvoltage between rail 5 and pad 3, the thyristor forming triac 23, forward-connected between rail 5 (in this case, positive) and pad 3 (in this case, negative) can be turned on. The PN junction formed between the anode and the anode gate of this thyristor tends to turn on and a strong positive voltage is transferred onto anode C of thyristor 75, having its cathode connected to negative pad 3. Thyristor 75 starts an avalanche and a current flows between rail 5 and pad 3, via the gate of triac 23 and thyristor 75. This gate current turns on triac 23. Triac 23 is thus made conductive, which enables to remove the overvoltage.

In case of a negative overvoltage between rail 5 and pad 3, the thyristor forming triac 23, forward-connected between pad 3 (in this case, positive) and rail 5 (in this case, negative) can be turned on. The PN junction formed between the anode and the anode gate of this thyristor tends to turn on, as well as diode 73. A current thus flows between rail 5 and pad 3, via the gate of triac 23 and diode 73. This gate current turns on triac 23. Triac 23 is thus made conductive, which enables to remove the overvoltage.

In case of a positive overvoltage between rails 5 and 7, the thyristor forming triac 27, forward-connected between rail 5 (in this case, positive) and rail 7 (in this case, negative) can be turned on. The PN junction formed between the anode and the anode gate of this thyristor tends to turn on and a positive voltage is transferred onto output node C of the second inverter. Further, the overvoltage provides a supply voltage to the inverters formed by transistors 65, 67, 69, and 71. Output node A of the edge detector being at a low state, output node B of the first inverter switches to a high state, which turns on N-channel MOS transistor 71 of the second inverter. A current thus flows between rails 5 and 7, via the gate of triac 27 and transistor 71. This gate current turns on triac 27. Triac 27 is thus made conductive, which enables to remove the overvoltage.

In case of a negative overvoltage between rails 5 and 7, the thyristor forming triac 27, forward-connected between rail 7 (in this case, positive) and rail 5 (in this case, negative) can be turned on. The PN junction formed between the anode and the anode gate of this thyristor tends to turn on, as well as diode 73. A current thus flows between rails 7 and 5, via the gate of triac 27 and diode 73. This gate current turns on triac 27. Triac 27 is thus made conductive, which enables to remove the overvoltage.

Figure 9:
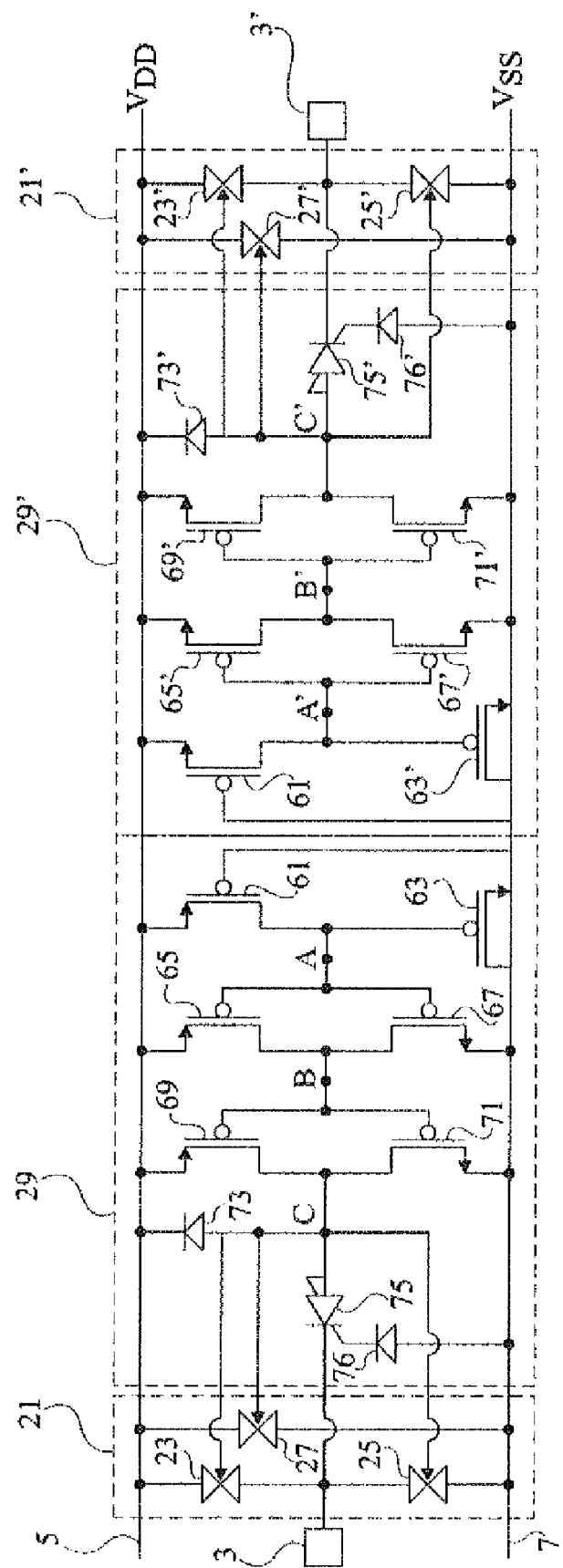
FIG. 9 illustrates the explanation of the removal of an overvoltage between input-output pads.

To explain the removal of an overvoltage between pads, reference will be made to FIG. 9. A protection structure 21' and a detection and turn-on circuit 29' identical to protection structure 21 and to detection and turn-on circuit 29 associated with pad 3 are associated with a pad 3'. The elements associated with pad 3 are designated with the same reference numerals as in FIG. 8. The elements associated with pad 3' are designated with the same reference numerals as the corresponding elements associated with pad 3, with a dash.

In case of a positive overvoltage between pads 3 and 3', the thyristors forming triacs 23 and 25, forward-connected between pad 3 and rails 5 and 7, and the thyristors forming triacs 23' and 25', reverse-connected between pad 3' and rails 5 and 7, can be turned on. The PN junctions formed between the respective anodes and anode gates of the above-mentioned thyristors, forming triacs 23 and 25, tend to turn on. A positive voltage is thus transferred onto anode C of diode 73, which becomes conductive. Thus, the overvoltage provides a supply voltage to the inverters formed by transistors 65, 67, 69, and 71. Output node A of the edge detector being at a low state, output node B of the first inverter switches to a high state, which turns on N-channel MOS transistor 71 of the second inverter. A positive voltage is thus transferred onto rail 7. Positive voltages being transferred onto rails 5 and 7, the PN junctions formed between the respective anodes and anode gates of the above-mentioned thyristors, forming triacs 23' and 25', tend to become conductive. A positive voltage is thus transferred onto anode C' of thyristor 75', having its cathode connected to negative pad 3'. Further, a positive voltage is transferred, via rail 7 and diode 76' (if provided), onto the cathode gate of thyristor 75'. Thyristor 75' is thus turned on. A current thus flows between positive pad 3 and negative pad 3', via the gates of triacs 23, 25, 23', and 25', diode 73, transistor 71, and thyristor 75'. This gate current turns on triacs 23, 25, 23', and 25'. Triacs 23, 25, 23', and 25' are thus made conductive, which enables to remove the overvoltage.

The disclosed detection circuit thus enables to turn on at least one triac of the protection structure, whatever the type of overvoltage occurring between two terminals of the integrated circuit.

Figure 2:
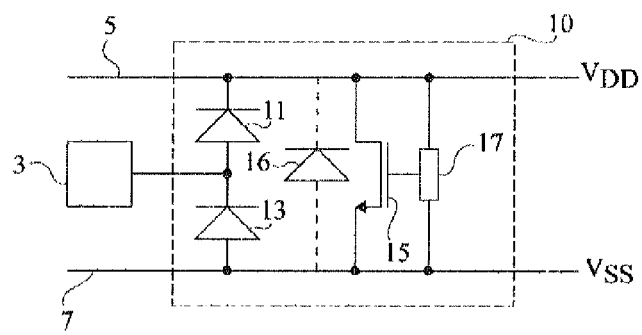
FIG. 2, previously described, shows an example of a structure of protection against overvoltages associated with a pad of an integrated circuit.
Figure 3:
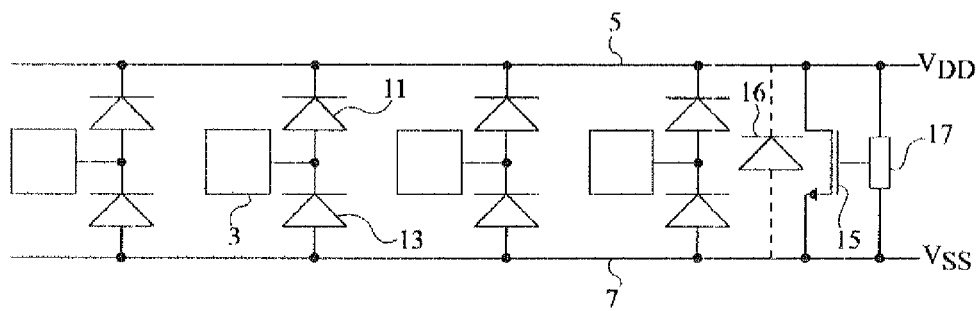
FIG. 3, previously described, illustrates an example of a structure for protecting of several pads of an integrated circuit.

According to advantage benefit of the present invention, the above-described elementary cell (FIGS. 5 to 7) is the only component necessary to form the structure of protection against overvoltages (FIG. 4). The cells of the structure are formed in the same N-type layer 33 (FIG. 5) and do not require to be isolated from one another. Thus, the silicon surface area useful to remove overvoltages is optimized with respect to prior art structures comprising three distinct components (FIGS. 2 and 3). Further, the provided protection structure is easier to form than conventional structures.

According to another benefit of the present invention, the provided protection structure provides paths for removing symmetrical overvoltages, whatever the polarity of the electrostatic discharges applied across the circuit.

According to still another benefit of the present invention, the provided protection structure does not disturb the normal circuit operation. Indeed, when the circuit is supplied, the triacs have very low leakage currents (a few pA/mm), conversely to prior art solutions comprising MOS transistors (FIGS. 2 and 3).

According to advantage still further benefit of the present invention, the provided protection structure does not limit the voltage excursion of the signals applied on the input-output pads of the integrated circuit. Indeed, the triacs are only turned on if they are enabled by the overvoltage detection circuit. Thus, signals of amplitude greater than high supply voltage $V_{DD}$ or lower than low supply voltage $V_{SS}$ may be applied to the input-output pads of the circuit. This voltage excursion is only limited by the detection and turn-on circuit. As indicated, this detection and turn-on circuit may be adapted to increase the voltage excursion.

Specific embodiments of the present invention have been described. Various alterations and modifications will occur to those skilled in the art. In particular, the protection ring-shaped area may be formed in an N-type substrate instead of a P-type substrate, all previously-described conductivity types being then inverted. Further, the present invention is not limited to the cell arrangements shown and described hereabove (FIGS. 5 to 7). It will be within the abilities of those skilled in the art to implement the desired operation, and especially the forming of triacs between the pads and rails of the circuit, whatever the arrangement and the number of elementary cells. Different matrixes of elementary cells may for example be associated with each circuit pad. It has been indicated that all the protection elements between pads are triacs. It may also be provided, if this is compatible with the integrated circuit manufacturing method, for some at least of these triacs to comprise no gate and to operate in break-over mode, then forming diacs (or double Shockley diode). Positive and negative voltages have further been mentioned in the description of an embodiment of the present invention and it should of course be understood that "positive" designates voltage greater than the voltages designated as "negative" and conversely. Often, the "negative" voltage will be the ground. Further, an embodiment of a circuit for detecting an overvoltage and for turning on protection triacs has been described hereabove in relation with FIG. 8. The present invention is not limited to this specific case. It will be within the abilities of those skilled in the art to implement the present invention whatever the circuit used, capable of turning on the protection triacs in case of an overvoltage between any two points of the circuit.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A structure for protecting an integrated circuit against electrostatic discharges, comprising an assembly of identical cells, each of which is connected to a terminal forming a pad of the circuit, a first supply rail or a second supply rail, the cells forming between any two of said terminals an assembly of four alternated layers of different conductivity types wherein:

the cells are arranged in a matrix;

the cells of consecutive parallel diagonals are interconnected;

the consecutive diagonals of interconnected cells are connected to terminals forming, in the following order: the first supply rail (5, VDD), a first pad (3), and the second supply rail (7, VSS); and the cells are formed in a layer of a first conductivity type of a first doping level, each cell comprising a well of a second conductivity type of a second doping level, containing on its surface side neighboring regions of doping levels greater than the first and second levels and of opposite conductivity types, in contact with a metallization connected to said terminal, wherein:

contact regions of the first conductivity type and of a doping level greater than the first level are arranged on the upper surface side of said layer and are capable of receiving a turn-on signal; and the contact regions are connected to the output of a turn-on circuit capable of providing a control signal in case of an overvoltage between any two of said terminals, wherein the turn-on circuit comprises:

an overvoltage detector capable of providing a high output signal when the integrated circuit is supplied;

a first inverter having its input (A) connected to the output of the detector;

a second inverter having its input (B) connected to the output of the first inverter, the output (C) of the second inverter forming the output of the turn-on circuit;

at least one first diode forward-connected between the output (C) of the second inverter and the first supply rail; and a thyristor forward-connected between the output (C) of the second inverter and a pad of the circuit, the anode and cathode gates of the thyristor being respectively connected to the output (C) of the second inverter and to the second supply rail.

2. The structure of claim 1, wherein:

said detector is formed of a first P-channel MOS transistor and of a first N-channel MOS transistor, the source and the drain of the first P-channel transistor being respectively connected to the first supply rail and to the gate of the first N-channel transistor, the gate of the first P-channel transistor and the source and the drain of the first N-channel transistor being connected to the second supply rail;

the first inverter is formed of a second P-channel MOS transistor and of a second N-channel MOS transistor and is supplied by the first and second supply rails; and the second inverter is formed of a third P-channel MOS transistor and of a third N-channel MOS transistor and is supplied by the first and second supply rails.

3. A structure for protecting an integrated circuit against electrostatic discharges, comprising an assembly of identical cells, each of which is connected to a terminal forming a pad of the circuit, a first supply rail or a second supply rail, the cells forming between any two of said terminals an assembly of four alternated layers of different conductivity types wherein:

the cells are arranged in a matrix;

the cells of consecutive parallel diagonals are interconnected;

the consecutive diagonals of interconnected cells are connected to terminals forming, in the following order: the first supply rail (5, VDD), a first pad (3), and the second supply rail (7, VSS); and each pair of cells forms a triac between two of said terminals.

\* \* \* \* \*